United States Patent
Takano

(10) Patent No.: US 7,924,651 B2
(45) Date of Patent: Apr. 12, 2011

(54) SEMICONDUCTOR STORAGE DEVICE AND RESETTING METHOD FOR A SEMICONDUCTOR STORAGE DEVICE

(75) Inventor: Susumu Takano, Kanagawa (JP)

(73) Assignee: Renesas Electronics Corporation, Kanagawa (JP)

(*) Notice: Subject to any disclaimer, the term of this patent is extended or adjusted under 35 U.S.C. 154(b) by 182 days.

(21) Appl. No.: 12/314,060

(22) Filed: Dec. 3, 2008

(65) Prior Publication Data

US 2009/0167377 A1    Jul. 2, 2009

(30) Foreign Application Priority Data

Dec. 27, 2007    (JP) .................. 2007-336420

(51) Int. Cl.
*G11C 8/00* (2006.01)

(52) U.S. Cl. .......... 365/233.1; 365/233.16; 365/233.17

(58) Field of Classification Search ........... 365/233.1, 365/233.11, 233.17
See application file for complete search history.

(56) References Cited

U.S. PATENT DOCUMENTS

| 5,905,690 A * | 5/1999 | Sakurai et al. ............ 365/233.1 |
| 6,826,114 B2 | 11/2004 | Lee et al. |
| 7,251,171 B2 | 7/2007 | Nishimura et al. |
| 2006/0203576 A1 * | 9/2006 | Nishimura et al. ........... 365/194 |

FOREIGN PATENT DOCUMENTS

| JP | 01-137494 | 5/1989 |
| JP | 2004-103222 A | 4/2004 |
| JP | 2006-252654 A | 9/2006 |

* cited by examiner

*Primary Examiner* — Hoai V Ho
*Assistant Examiner* — Jason Lappas
(74) *Attorney, Agent, or Firm* — Foley & Lardner LLP

(57) ABSTRACT

An exemplary aspect of an embodiment of the present invention is a semiconductor storage device including a power-on reset generator that outputs a first reset signal in accordance with a level of a power supply voltage, a command decoder that moves to a mode set state in accordance with input of an external control pin and outputs mode set information in accordance with a command input from an address pin, an MRS controller that outputs a mode reset signal (MRSPON signal) in accordance with the mode set information, and a reset circuit that outputs a second reset signal initializing each circuit of an operation control section in accordance with the mode reset signal and the first reset signal.

15 Claims, 3 Drawing Sheets

SEMICONDUCTOR STORAGE DEVICE AND RESETTING METHOD FOR A SEMICONDUCTOR STORAGE DEVICE

BACKGROUND

1. Field of the Invention

The present invention relates to a semiconductor storage device, and more particularly, to a semiconductor storage device including a power-on reset circuit inside thereof.

2. Description of Related Art

In a system including a semiconductor storage device (hereinafter referred to as memory), the whole system may be hung up by unexpected events (system abnormal operation, power supply drop due to noise, and so on) during the operation. In this case, it is needed to execute a soft reset by external control as a memory setting state becomes unclear, so as to reliably reset the internal part of the memory.

FIG. 3 is a diagram showing a configuration example of a semiconductor device of a memory according to a related art. When the power is turned on, an initialization process of each circuit is executed by a power-on reset signal (PONZ signal). Further, when a mode register set command is input from outside after the power is turned on, the soft reset resetting each circuit other than an internal power supply generator $20p$ is executed by a mode register set signal (MRSPON signal) output from an MRS controller $64p$.

For example, Japanese Unexamined Patent Application Publication No. 2004-103222 discloses a technique of resetting a block related to a data path employing an external signal applied at a certain level in the soft reset. According to this technique, data conflicts or ineffective data can be prevented in executing operations according to the read/write commands applied after the soft reset.

Japanese Unexamined Patent Application Publication No. 01-137494 discloses a technique of automatically generating a reset signal to initialize a memory control part when a circuit of the memory control part falls into an unoperable state.

Further, Japanese Unexamined Patent Application Publication No. 2006-252654 discloses a technique of reliably resetting an internal circuit of a semiconductor memory by external control. In this technique, a mode register set by a predetermined bit is executed by employing a technique of applying the mode register setting the operation mode of the memory, in order to generate the soft reset signal and reset the internal circuit. As such, it is possible to reliably reset the internal circuit of a memory.

However, according to the reset technique in which the signal same to the power-on signal generated in the starting operation is again generated from the mode register set command, the power-on signal from the mode register set command resets the system of the whole memory. Since the power-on signal typically needs to be generated only in the starting operation, the power-on signal is generated when voltage lower than the voltage supplied to the device of normal operation specifications is detected. Thus, when the power-on signal is again generated from the mode register set command, the soft reset cannot be accurately operated. This is because the power supply has already been supplied enough and the system of the whole memory is reset at a voltage higher than the starting operation; therefore, the power consumption increases and the reset operation itself becomes a source of the noise.

Further, in recent years, the memory capacity has been increasing and the circuit configuration has been complicated, which increases the time required for the starting operation after the power-on. When the system of the whole memory is reset, the time required for the recovery increases as well. Accordingly, a function of resetting the controller setting the internal operation from the mode register set command has been demanded.

SUMMARY

The present inventors have thus found a problem that it is difficult to reliably reset the controller setting the internal operation in the soft reset.

A first exemplary aspect of an embodiment of the present invention is a semiconductor storage device, including a voltage detector that outputs a first reset signal in accordance with a level of a power supply voltage, a command decoder that moves to a mode set state in accordance with input of an external control pin and outputs mode set information in accordance with a command input from an address pin, a mode register set circuit that outputs a mode reset signal in accordance with the mode set information, and a reset circuit that outputs a second reset signal initializing an internal operation set circuit in accordance with the mode reset signal and the first reset signal. It is possible to initialize the controller setting the internal operation by the second reset signal separately from the first reset signal.

According to the present invention, it is possible to reliably reset the controller setting the internal operation in the soft reset.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

Hereinafter, an exemplary embodiment of the present invention will be described with reference to the drawings. Some parts of the description below and the drawings are omitted and simplified as appropriate for the sake of clarity. The same components in each drawing are denoted by identical reference symbols, and the description will be omitted.

Hereinafter, the operation of a soft reset according to an exemplary embodiment will be described. In this specification, assuming a case in which a synchronous memory is mounted in a computer system, a hard reset is a reset processing which is executed by turning a power supply of the computer system from on to off. On the other hand, the soft reset is the processing resetting the computer system by using a specific reset key without turning off the power supply of the system.

First Exemplary Embodiment

Figure 1:
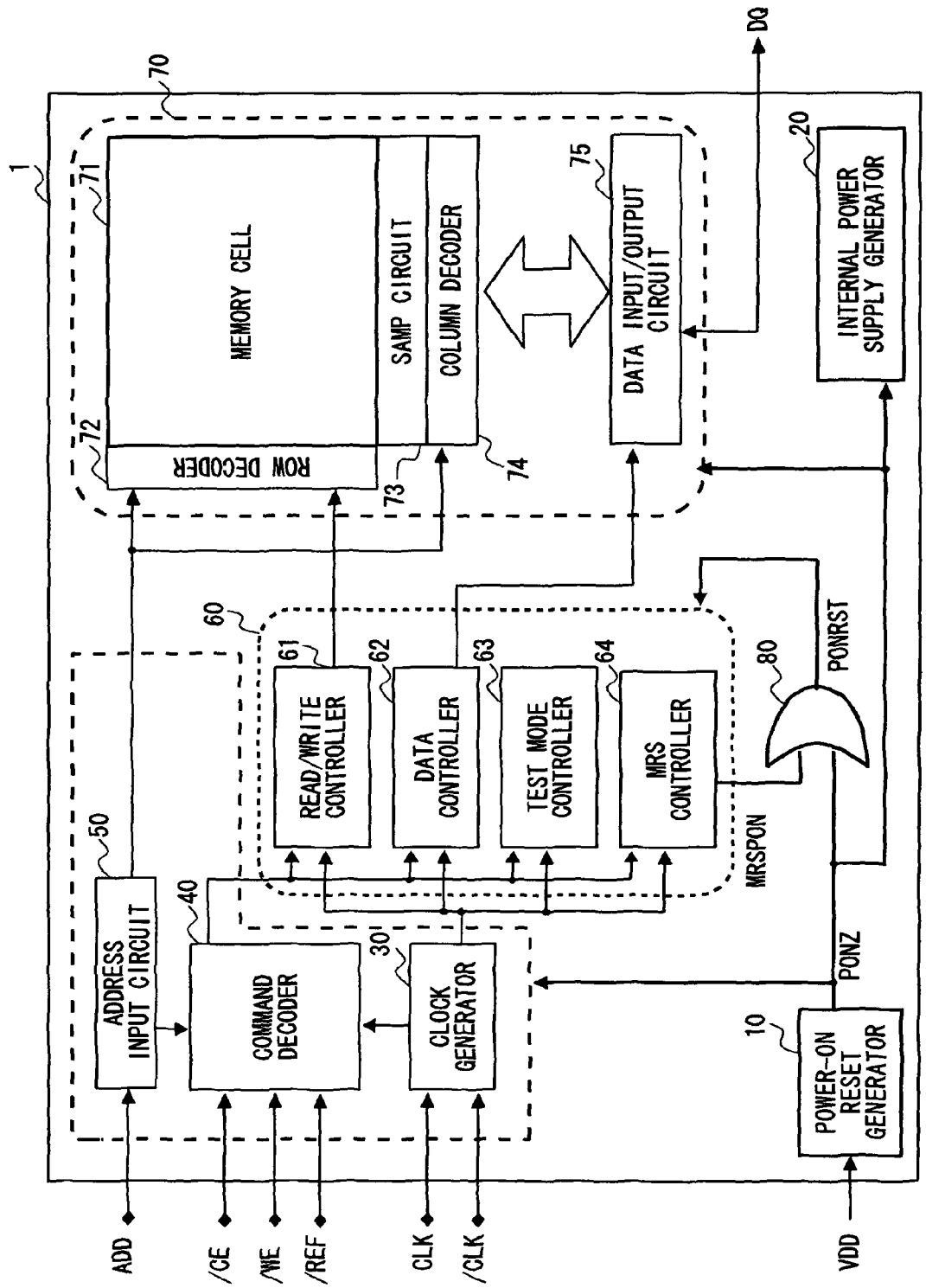
FIG. 1 is a block diagram showing a configuration example of a semiconductor device of a memory according to a first exemplary embodiment of the present invention.

FIG. 1 is a block diagram showing a configuration example of a semiconductor device of a memory according to a first exemplary embodiment of the present invention. A semiconductor device 1 shown in FIG. 1 includes a power-on reset generator (voltage detector) 10, an internal power supply generator 20, a clock generator 30, a command decoder 40, an address input circuit 50, an operation control section 60, a memory section 70, and a reset circuit (OR circuit) 80. In the first exemplary embodiment, the operation control section (internal operation set circuit) 60 includes a read/write controller 61, a data controller 62, a test mode controller 63, and an MRS (Mode Resister Set) controller (mode register set circuit) 64, as an example. Further, in the first exemplary embodiment, the memory section 70 includes a memory cell 71, a row decoder 72, an SAMP circuit 73, a column decoder 74, and a data input/output circuit 75.

The clock generator 30 generates a clock (local clock) in the semiconductor device 1 to supply the clock to the command decoder 40 and each circuit of the operation control section 60.

The power-on reset generator 10 sets a state of a power-on reset signal (PONZ signal, first reset signal) to an ON state (low level, in this example) when an external power supply voltage (VDD) is lower than a predetermined voltage. The PONZ signal is output to the internal power supply generator 20 and the memory section 70. When the external power supply voltage (VDD) becomes higher than the predetermined voltage, the power-on reset generator 10 sets the state of the power-on reset signal to an OFF state (high level, in this example).

The command decoder 40 receives external commands and decodes the received external commands to output the decoded external commands to each circuit of the operation control section 60. The command decoder 40 receives as external commands a chip enable signal (/CE), a write enable signal (/WE), and a refresh signal (/REF) from each external input pin, as an example. Further, the command decoder 40 includes a mode register. When the chip enable signal, the write enable signal, and the refresh signal are in the OFF state (low level, in this example), the data can be input from an address pin (ADD), and the command decoder 40 sets mode set information in the mode register according to the input data. In the first exemplary embodiment, the command decoder 40 receives a start command or an end command of a soft reset from the address pin to set these commands in the mode register. The mode set information set in the mode register is output to each circuit of the operation control section 60.

The address input circuit 50 receives an address of the memory or the external command from outside. The data input from the address input circuit 50 is input to the row decoder 72 and the column decoder 74. Also the data input from the address input circuit 50 is input to the command decoder 40 when the chip enable signal, the write enable signal, and the refresh signal are in the OFF state.

The operation control section 60 controls each operation based on the command signal input from the command decoder 40. The read/write controller 61 receives the command of read/write from the command decoder 40 to control the operation of reading/writing in the memory section 70 based on the address input from the address input circuit 50 to the memory section 70. The data controller 62 receives the command of data control from the command decoder 40 to control the data format when the read/write controller 61 accesses the memory section 70. The test mode controller 63 receives from the command decoder 40 the command whether the mode is the test mode or not to set the mode.

The MRS controller 64 controls the start and the end of the soft reset based on the mode set information. The MRS controller 64 changes the level of the mode register set signal (MRSPON signal) in accordance with the start command and the end command of the soft reset to designate the start and the end of the soft reset.

Note that the operation control section 60 at least includes an MRS controller 64. The operation control section 60 may include other controllers as well as long as each of the controllers receives the command signal or the command set information from the command decoder 40.

Upon detecting that at least one of the PONZ signal and the MRSPON signal is in the ON state (low level, in this example), the reset circuit 80 changes the state of the PONRST signal (second reset signal) designating the soft reset to the ON state (low level, in this example) to output the signal to each circuit of the operation control section 60. Accordingly, since the PONZ signal is generated from the power-on reset generator 10 when the power supply is raised, the PONRST signal is in the ON state. Further, when the soft reset is required by the external command, the PONRST signal is in the ON state since the MRSPON signal is produced from the MRS controller 64.

Figure 2:
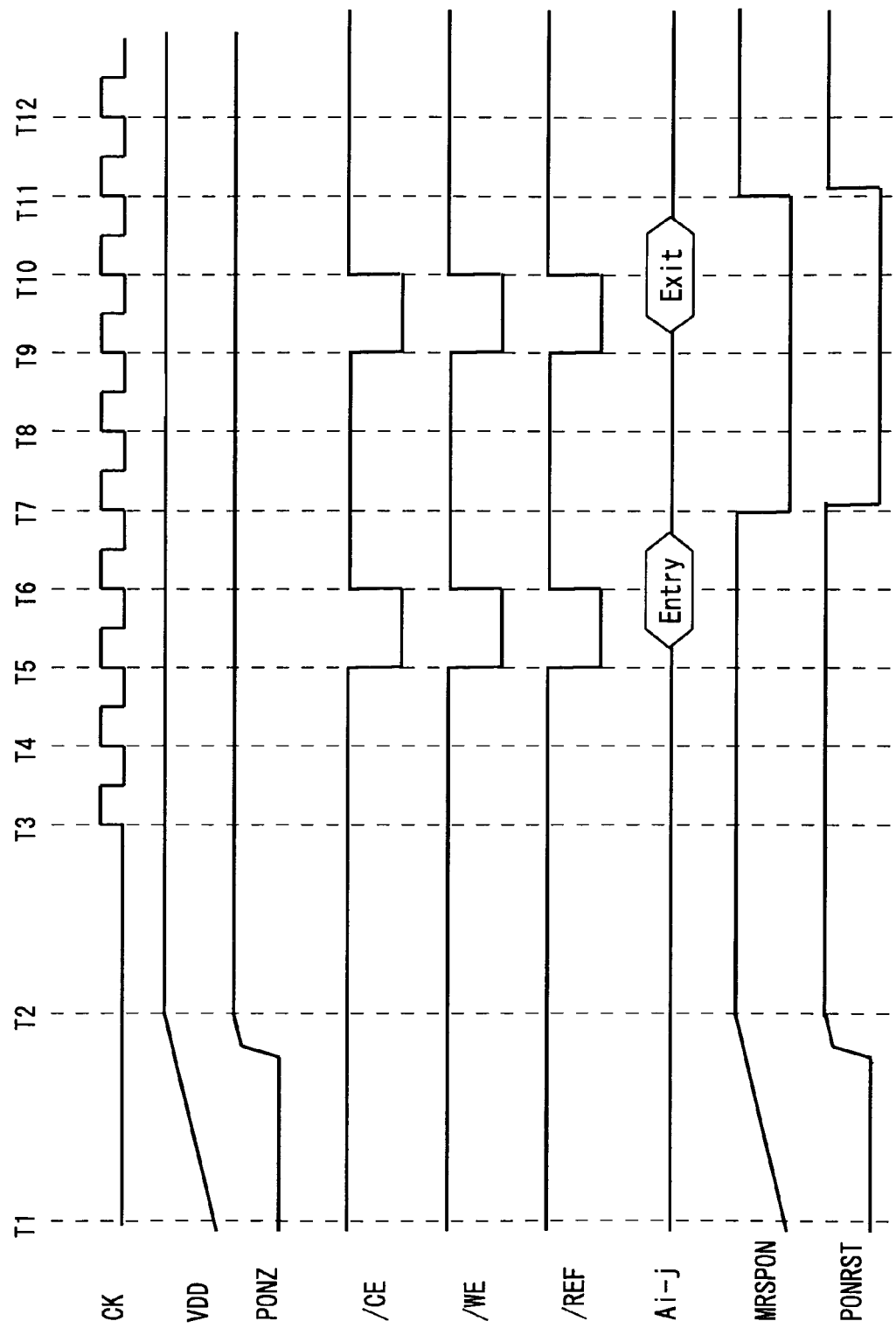
FIG. 2 is a sequence diagram showing an operation example of the semiconductor device.
Figure 3:
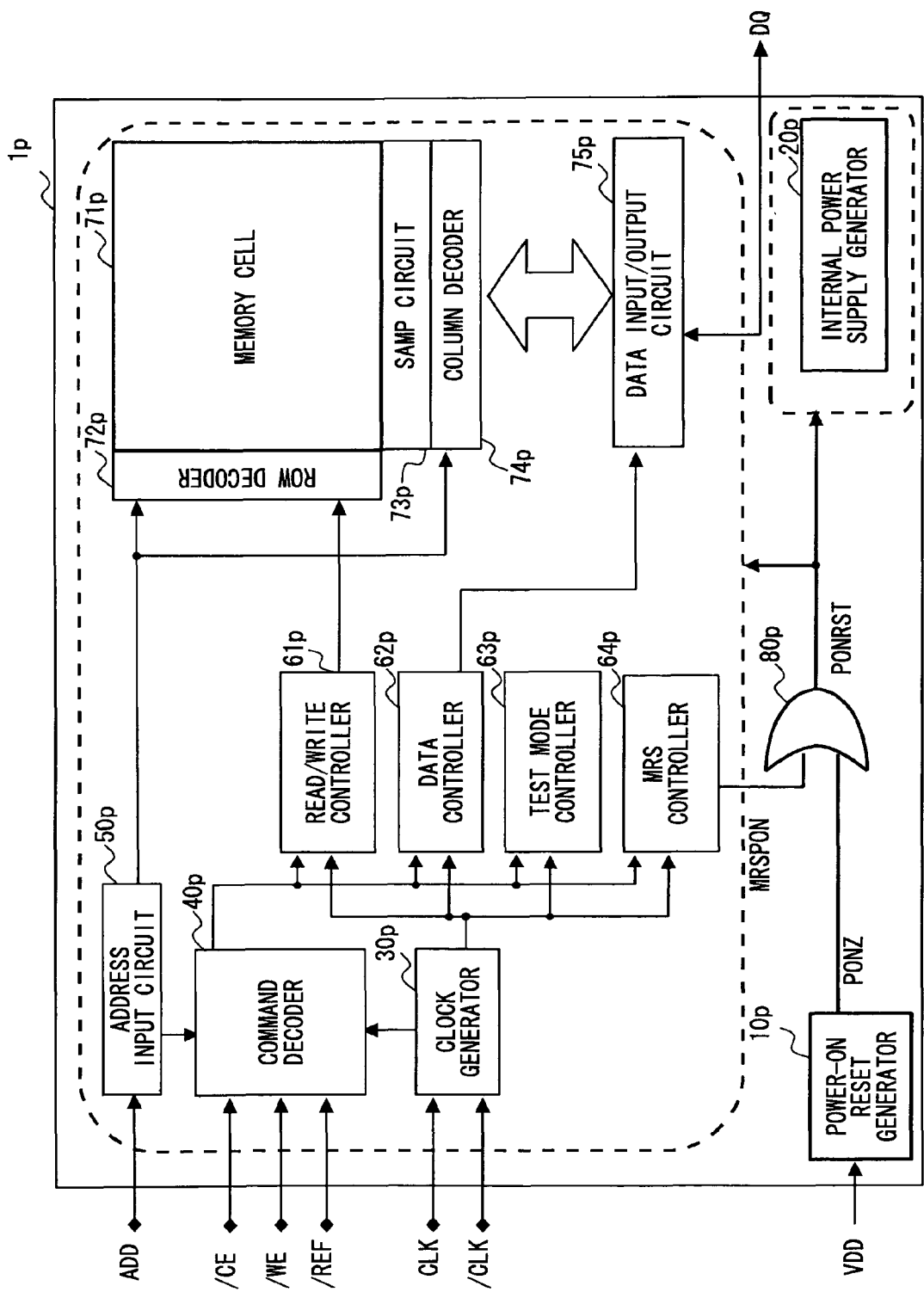
FIG. 3 is a diagram showing a configuration example of a semiconductor device of a memory according to a related art.

Now, the operation of the semiconductor device according to the first exemplary embodiment will be described. FIG. 2 is a sequence diagram showing the operation example of the semiconductor device. The initialization process is started from a step (T1) in which the power supply of the computer system is turned on. The reset circuit 80 outputs the low-level PONRST signal in synchronization with the low level PONZ signal (T1 to T2). As shown in FIG. 1, in the semiconductor device 1, each circuit of the internal power supply generator 20, the clock generator 30, the command decoder 40, and the memory section 70 executes initialization process in accordance with the PONZ signal. Further, each circuit of the operation control section 60, more specifically, the read/write controller 61, the data controller 62, the test mode controller 63, and the MRS controller 64, executes initialization process in accordance with the PONRST signal.

When the clock is started to be supplied from the clock generator 30 (T3) and it is needed to perform the soft reset during a time at which the system is working, the state moves to the mode set state. More specifically, the chip enable signal, the write enable signal, and the refresh signal are in the low level, so that the external command input from an address pin (Ai-j) is input to the command decoder 40 through the address input circuit 50 (T5). The entry code starting the soft reset mode is input from the address pin (T6). The command decoder 40 sets the entry code in the mode register to output the mode set information for starting the soft reset. The MRS controller 64 sets the level of the MRSPON signal to the low level in accordance with the input of the mode set information for starting the soft reset (T7). The reset circuit 80 outputs the low-level PONRST signal in synchronization with the generation of the falling edge of the MRSPON signal.

Accordingly, the soft reset state is started, and each circuit of the operation control section 60 starts the initialization process.

In terminating the soft reset, the state again moves to the mode set state, and the external command input from the address pin is input to the command decoder 40 through the address input circuit 50 (T9). The exit code for terminating the soft reset mode is input from the address pin (T10). The command decoder 40 sets the exit code in the mode register, and outputs the mode set information for terminating the soft reset. The MRS controller 64 sets the level of the MRSPON signal to high level in accordance with the input of the mode set information for terminating the soft reset (T11). The reset circuit 80 outputs the high-level PONRST signal in synchronization with the generation of rising edge of the MRSPON signal. Thus, the soft reset state is terminated.

As such, the soft reset period can be set as appropriate by inputting the entry code and the exit code from outside. The soft reset period is determined by an order of μs (microsecond) to ms (millisecond), which is different depending on the environment (temperature, implement condition, for example) of the semiconductor device 1.

As described above, according to an exemplary aspect of the first embodiment of the present invention, the initialization of the operation mode is reliably executed by the command input from outside. More specifically, all the systems of the whole memory are the reset object when the power supply is turned on, which makes it possible to normally start the operation of the chip as in the related art. Further, when the whole system is hung up due to the system abnormal operation or the power supply drop due to the noise during the operation and it is desired to reset the memory, the mode register set (entry code, exit code) designating the specific address for the soft reset is executed. Accordingly, the MRSPON signal is generated, and the reset is executed only on the read/write controller 61, the data controller 62, the test mode controller 63, and the MRS controller 64.

Furthermore, the start and the end of the reset period can be set by setting the entry code and the exit code in the mode register, so as to be able to secure the period needed for the reset operation.

In the related art, the soft reset is executed while keeping the power supply level of the system, which increases the power consumption and increases the probability that the reset operation itself becomes the source of the noise when the reset operation is performed as in the time when the power supply is turned on.

According to the first exemplary embodiment of the present invention, only the minimum parts of the system are reset in order to suppress the power consumption and prevent the influence of the noise, whereby it is possible to reliably execute the soft reset.

Note that the reset by the PONRST signal may include a case of initializing only the MRS controller 64 included in the operation control section 60 or may include a case of initializing a part of the controller including the MRS controller 64 in the above exemplary embodiment.

As described above, according to an exemplary aspect of the present invention, the memory chip is again set to the mode register set state of the original default while suppressing the power supply noise due to the reset operation.

Accordingly, even when the whole system is hung up, it is possible to reliably realize the system restart. Further, by securing the enough reset period, the reset can be realized without fail. It is possible to reduce the time required to return to the state capable of realizing the restart operation by limiting the circuit to be reset. Further, compared with the technique of executing the soft reset on the system of the whole memory as in the related art, the present invention makes it possible to suppress the power consumption and prevent the influence of the noise by resetting the minimum parts of the system of the memory chip, so as to reliably execute the soft reset.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. A semiconductor storage device, comprising:
   a voltage detector that outputs a first reset signal in accordance with a level of a power supply voltage;
   a memory section comprising a memory cell array, and receiving the power supply voltage;
   a command decoder that moves to a mode set state in accordance with input of an external control pin and outputs mode set information in accordance with a command input from an address pin;
   an internal operation set circuit controlling the operation of at least one of reading and writing in the memory section; the internal operation set circuit comprising a mode register set circuit that outputs a mode reset signal in accordance with the mode set information; and
   a reset circuit that outputs a second reset signal initializing at least the mode register set circuit of the internal operation set circuit in accordance with the mode reset signal and the first reset signal without resetting the memory section.

2. The semiconductor storage device according to claim 1, wherein a period of performing initialization by the second reset signal is set by the command input to the command decoder.

3. The semiconductor storage device according to claim 1, wherein
   the command decoder receives a start command starting initialization by the second reset signal and an end command terminating the initialization, and
   the reset circuit continues the initialization by the second reset signal from when the start command is input until when the end command is input.

4. The semiconductor storage device according to claim 2, wherein
   the command decoder receives a start command starting initialization by the second reset signal and an end command terminating the initialization, and
   the reset circuit continues the initialization by the second reset signal from when the start command is input until when the end command is input.

5. The semiconductor storage device according to claim 1, wherein the reset circuit initializes a plurality of circuits receiving mode set information from the command decoder.

6. The semiconductor storage device according to claim 2, wherein the reset circuit initializes a plurality of circuits receiving mode set information from the command decoder.

7. The semiconductor storage device according to claim 3, wherein the reset circuit initializes a plurality of circuits receiving mode set information from the command decoder.

8. The semiconductor storage device according to claim 4, wherein the reset circuit initializes a plurality of circuits receiving mode set information from the command decoder.

9. The semiconductor storage device according to claim 1, wherein the reset circuit initializes the internal operation set circuit in accordance with the second reset signal, the internal operation set circuit further comprising at least one of a read/write controller that controls an operation of at least one of reading and writing in accordance with the mode set information, a data controller that controls data format in accordance with the mode set information, and a test mode controller that controls a test mode, the second reset signal initializing at least one of the read/write controller, data controller and the test mode controller.

10. The semiconductor storage device according to claim 9, wherein the internal operation set circuit comprises the mode register set circuit, the read/write controller, the data controller, the test mode controller, the second reset signal initializing at least one of the read/write controller, data controller and the test mode controller.

11. A resetting method for a semiconductor storage device comprising a memory section comprising a memory cell array, and an internal operation set circuit controlling the operation of reading and writing in the memory section; the internal operation set circuit comprising a mode register set circuit, the method comprising:
- outputting a first reset signal in accordance with a level of a power supply voltage;
- moving to a mode set state in accordance with input of an external control pin;
- outputting, via the mode register set circuit, mode set information in accordance with a command input from an address pin;
- outputting a mode reset signal in accordance with the mode set information; and
- outputting a second reset signal initializing at least the mode register set circuit of the internal operation set circuit in accordance with the mode reset signal and the first reset signal without resetting the memory section.

12. The semiconductor storage device according to claim 1, wherein the reset circuit initializes the internal operation set circuit in accordance with the second signal, the internal operation set circuit further comprising at least one of a read/write controller that controls an operation of at least one of reading and writing in accordance with the mode set information, a data controller that controls data format in accordance with the mode set information, and a test mode controller that controls a test mode, the second reset signal initializing only the mode register set circuit, but not the at least one of the read/write controller, data controller and the test mode controller.

13. The method according to claim 11, wherein the internal operation set circuit further comprises at least one of a read/write controller that controls an operation of at least one of reading and writing in accordance with the mode set information, a data controller that controls data format in accordance with the mode set information, and a test mode controller that controls a test mode, the method further comprising:
- initializing, via the second reset signal, at least one of the read/write controller, data controller and the test mode controller.

14. The method according to claim 13, wherein the internal operation set circuit comprises the mode register set circuit, the read/write controller, the data controller, and the test mode controller, the method further comprising:
- initializing, via the second reset signal, at least one of the read/write controller, data controller and the test mode controller.

15. The method according to claim 11, wherein the internal operation set circuit further comprises at least one of a read/write controller that controls an operation of at least one of reading and writing in accordance with the mode set information, a data controller that controls data format in accordance with the mode set information, and a test mode controller that controls a test mode, the method further comprising:
- initializing, via the second reset signal, only the mode register set circuit, but not the at least of the one of the read/write controller, data controller and the test mode controller.

* * * * *